United States Patent
Li et al.

(10) Patent No.: US 9,219,504 B2
(45) Date of Patent: Dec. 22, 2015

(54) LEH MEMORY MODULE ARCHITECTURE DESIGN IN THE MULTI-LEVEL LDPC CODED ITERATIVE SYSTEM

(71) Applicant: LSI Corporation, Milpitas, CA (US)

(72) Inventors: Zongwang Li, Dublin, CA (US); Lei Chen, Sunnyvale, CA (US); Shaohua Yang, San Jose, CA (US); Johnson Yen, Fremont, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 126 days.

(21) Appl. No.: 13/663,006

(22) Filed: Oct. 29, 2012

(65) Prior Publication Data

US 2014/0122971 A1    May 1, 2014

(51) Int. Cl.
*H03M 13/00* (2006.01)
*H03M 13/27* (2006.01)
*H03M 13/11* (2006.01)

(52) U.S. Cl.
CPC ...... *H03M 13/6505* (2013.01); *H03M 13/1111* (2013.01); *H03M 13/1137* (2013.01); *H03M 13/27* (2013.01); *H03M 13/6331* (2013.01)

(58) Field of Classification Search
CPC ... H03M 13/09; H03M 13/091; H03M 13/13; H03M 13/27; H03M 13/1515; H03M 13/3753; H03M 13/3905; H03M 13/4138; H03M 13/6337; H03M 13/1102; H03M 13/6508; H03M 13/1008; H03M 13/1111; H03M 13/1137; H03M 13/6331; H03M 13/6505; H04L 1/0061; H04L 1/0057; H04L 1/0045; G11C 29/00; G06F 15/76; G06F 9/02
USPC ......... 714/724, 726, 737, 752, 755, 756, 758, 714/763, 764, 766, 780, 784
See application file for complete search history.

(56) References Cited

U.S. PATENT DOCUMENTS 7,783,952 B2    8/2010    Nimbalker et al.
8,205,123 B2    6/2012    Yang et al.
(Continued)

OTHER PUBLICATIONS

Kiran K. Gunnam, "Next Generation Iterative LDPC Solutions for Magnetic Recording Storage", Invited presentation at 42nd Asilomar Conference on Signals, Systems and Computers, Oct. 2008, pp. 1-42.*

(Continued)

*Primary Examiner* — Albert Decady
*Assistant Examiner* — Enamul M Kabir

(57) ABSTRACT

A memory in a LDPC decoding system includes data banks organized into a ping-pong memory. The ping-pong memory is connected to an interleaver and a de-interleaver. The interleaver interleaves L values; the interleaved L values are then stored in the ping-pong memory. A LDPC decoder retrieves L values from the ping-pong memory and returns E values to the ping-pong memory. The de-interleaver de-interleaves the E values and sends data to a LE queue and HD queue.

20 Claims, 6 Drawing Sheets

(56) References Cited

U.S. PATENT DOCUMENTS

| | | | |
|---|---|---|---|
| 2008/0104474 A1 | 5/2008 | Gao et al. | |
| 2009/0199071 A1* | 8/2009 | Graef | 714/757 |
| 2009/0273492 A1* | 11/2009 | Yang et al. | 341/81 |
| 2010/0042891 A1* | 2/2010 | Gunnam et al. | 714/752 |
| 2010/0042906 A1* | 2/2010 | Gunnam et al. | 714/780 |
| 2010/0268918 A1* | 10/2010 | Priewasser et al. | 712/208 |
| 2010/0275088 A1* | 10/2010 | Graef | 714/752 |
| 2010/0281328 A1* | 11/2010 | Lakkis | 714/752 |
| 2011/0029837 A1* | 2/2011 | Yang et al. | 714/758 |
| 2012/0017132 A1* | 1/2012 | Gunnam | 714/752 |
| 2012/0079340 A1* | 3/2012 | Gunnam et al. | 714/752 |

OTHER PUBLICATIONS

Kiran K. Gunnam, "Next Generation Iterative LDPC Solutions for Magnetic Recording Storage", Invited presentation at 42nd Asilomar Conference on Signals, Systems and Computers, Oct. 2008.

Kiran K. Gunnam, Gwan S. Choi, Mark B. Yeary, "Value-Reuse Properties of Min-Sum forGF(q)", Texas A&M Technical Note, report dated Oct. 2006, available for unrestricted access since Jul. 2008 http://www.ewh.ieee.org/r6/scv/ssc/Feb2008/VR_NB_v1.pdf.

\* cited by examiner

LEH MEMORY MODULE ARCHITECTURE DESIGN IN THE MULTI-LEVEL LDPC CODED ITERATIVE SYSTEM

FIELD OF THE INVENTION

The present invention is directed generally toward low-density parity-check (LDPC) codes and more particularly toward an efficient LEH memory architecture.

BACKGROUND OF THE INVENTION

In most real signal transmission applications there can be several sources of noise and distortions between the source of the signal and its receiver. As a result, there is a strong need to correct mistakes in the received signal. As a solution for this task one should use some coding technique with adding some additional information (i.e., additional bits to the source signal) to ensure correcting errors in the output distorted signal and decoding it. One type of coding technique utilizes low-density parity-check (LDPC) codes. LDPC codes are used because of their fast decoding (linearly depending on codeword length) property.

LE queues and hard decision (HD) memory are separate memories utilized in LDPC processing. HD ping-pong memory is a type a page flipping memory used to store hard decision data from LDPC decoders. HD ping-pong memory transfers hard decision data to an HD queue and is a true ping-pong memory similar in structure to LE ping-pong memory. HD ping-pong memory has one dedicated write port to receive hard decision bits from a decoder. Similarly, it has one dedicated read port to serve the hard decision values read to a HD queue. While a LE queue holds either L or E values for a packet. Log-likelihood ratios (LLRs or L values) are received from a detector after detecting is concluded and is preserved until an LDPC decoding is finished. Extrinsic LLR values (E values) overwrite the space occupied by L values at the end of decoding if further global iterations are necessary. L values are derived from the detector through global interleaving. E values are supplied to the detector through global de-interleaving.

Several memory modules create architectural complexity and latency. Consequently, it would be advantageous if an apparatus existed that is suitable for combining LE queues and HD memory in a LDPC decoder.

SUMMARY OF THE INVENTION

Accordingly, the present invention is directed to a novel method and apparatus for combining LE queues and HD memory in a LDPC decoder.

LEH memory is the combination of a LE queue and HD memory. LEH memory is a true ping-pong memory with one dedicated write port to receive an L value from a LE queue memory and write the extrinsic information at the very last local iteration. The write port of LEH memory also needs to write HD symbols from a decoder every cycle through a bit-enabled method. LEH memory has one dedicated read port to serve the extrinsic values read to LE memory and a log likelihood ratio (LLR) value to the decoder.

During LE unload, HD data in LEH memory are also unloaded to a de-interleaver before a HD queue. LEH memory has sixteen physical memories, eight banks being fifty-four bits in depth and one hundred sixty-eight bits in width and eight banks being fifty-four bits in depth and two hundred sixteen bits in width.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
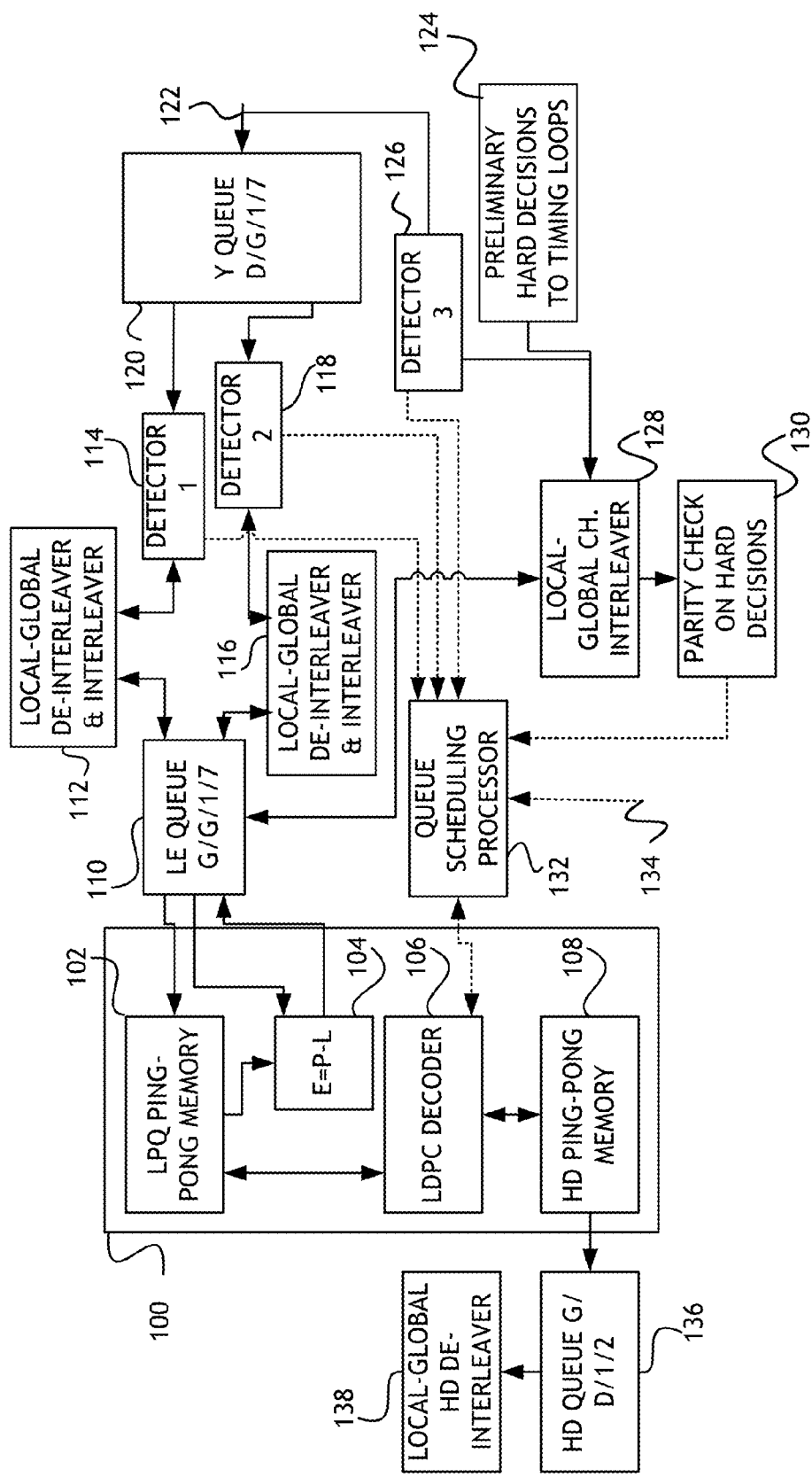
FIG. 1 shows a block diagram of a system for iteratively decoding a LDPC message.

Referring to FIG. 1, a block diagram of a system for iteratively decoding a LDPC message is shown. The system may include a soft-input soft-output decoder 100. The soft-input soft-output decoder 100 may include a low-priority queue (LPQ) ping-pong memory 102. The LPQ memory 102 may be configured to receive one or more L values from a LE queue 110. The soft-input soft-output decoder 100 may also include an E value calculator 104 configured to receive a L value from the LE queue 110 and data from the LPQ memory 102, and calculate an E value; the E value may then be sent to the LE queue 110. The LE queue 110 may send L values at a rate of twelve L samples per cycle and the E value calculator 104 may return E values at a rate of twelve E samples per cycle. The soft-input soft-output decoder 100 may also include a LDPC decoder 106. The LDPC decoder 106 may receive data from the LPQ memory 102 and attempt to decode a LDPC encoded message. In some cases, decoding a LDPC encoded message may result in a hard decision. The LDPC decoder 106 may store hard decisions in a hard decision (HD) ping-pong memory 108. The soft-input soft-output decoder 100 may be connected, through the HD ping-pong memory 108, to a HD queue 136. The HD queue 136 may send HD data to a local-global HD de-interleaver 138.

The LE queue 110 may be connected to a first local-global de-interleaver & interleaver 112 and a second local-global de-interleaver & interleaver 116. The first local-global de-interleaver & interleaver 112 may receive L values form a first detector 114, interleave those L values and send the interleaved L values to the LE queue 110. Likewise, the second local-global de-interleaver & interleaver 116 may receive L values form a second detector 118, interleave those L values and send the interleaved L values to the LE queue 110. Furthermore, each of the first local-global de-interleaver & interleaver 112 and second local-global de-interleaver & interleaver 116 may receive interleaved E values form the LE queue 110, de-interleave those E values and send such de-interleaved valued to the first detector 114 and second detector 118 respectively. In at least one embodiment, L and E values may be sent and received at a rate of sixteen samples per cycle.

Each of the first detector 114 and second detector 118 may be connected to a Y queue 120. The Y queue 120 may store one or more corner points (Y values) 122 useful for decoding LDPC encoded messages. The Y queue 120 may receive Y values 122 at a rate of four samples per cycle. Each of the first detector 114 and the second detector 118 may determine one or more L values based on one or more Y values 122 in the Y queue 120.

The system may also include a third detector 126 to receive Y values 122 directly and calculate L values. The third detector 126 may send the calculated L values to a preliminary hard decision unit 124 and to a local-global channel interleaver 128. The local-global channel interleaver 128 may send interleaved L values and receive interleaved L values from the LE queue 110. The local-global channel interleaver 128 may send corner points (X values) to a parity check unit 130. The parity check unit 130 may be configured to perform parity checks for hard decisions.

The system may also include a queue scheduling processor 132. The queue scheduling processor 132 may receive L values from the first detector 114, the second detector 118 and the third detector 126. The queue scheduling processor 132 may also receive parity check data from the parity check unit 130 and packet quality data from one or more front end signal processing blocks (not shown). The queue scheduling processor may then schedule decoding operations in the LDPC decoder 106 according to some algorithm and receive results of such decoding to update the queue schedule.

Figure 2:
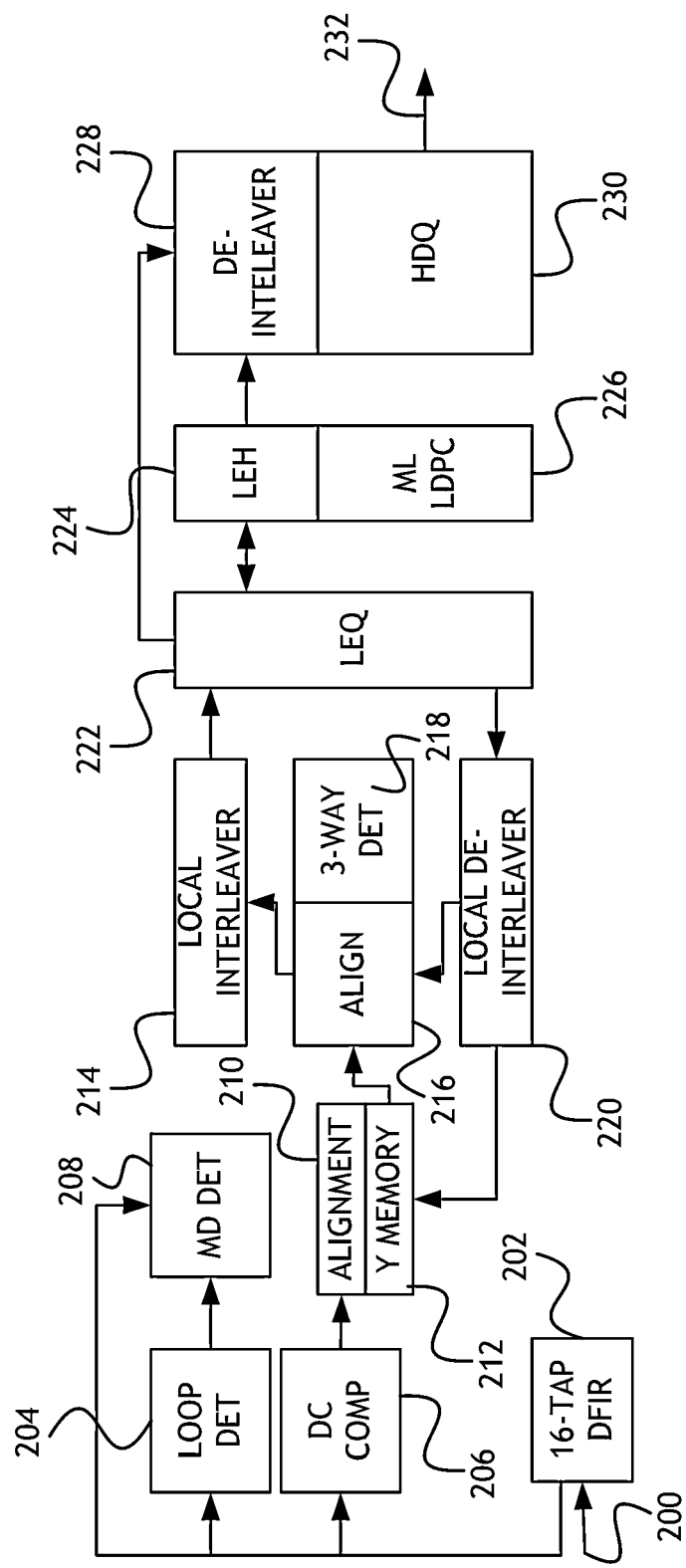
FIG. 2 shows a block diagram of a multi-level system for iteratively decoding a LDPC message.

Referring to FIG. 2, a block diagram of a multi-level system for iteratively decoding a LDPC message is shown. The system may include a sixteen tap digital finite impulse response (DFIR) circuit 200. The DFIR circuit 200 may receive LDPC encoded messages at a rate of four samples per cycle. The output from the DFIR circuit 200 may be sent to a DC comparator 206, a loop detector 204 and a MD detector 208.

Output from the DC comparator 206 may be sent to a first alignment unit 210 to align LDPC encoded bits in an LDPC block. Certain corner points of the aligned bits may be stored in a Y memory unit 212. Y messages in the Y memory unit 212 may be sent to a second alignment unit 216 to align bits in one or more Y messages and bits in one or more L values or E values received from a local de-interleaver 220. The second alignment unit 216 may receive Y messages at a rate of eighteen samples per cycle and L values or E values at a rate of nine samples per cycle. During alignment by the second alignment unit 216, Y messages may be processed by a 3-way detector 218.

The second alignment unit 216 may send aligned bits to a local interleaver 214 that may interleave values and send the interleaved messages to a LE queue 222. The LE queue 222 may send interleaved L values or E values to the local de-interleaver 220. The LE queue 222 may also send interleaved L values or E values to a LEH memory 224. The LEH memory 224 may include elements of a LE memory and a HD memory. The LEH memory 224 may interact with a multi-layered LDPC decoder 226 by sending multiple L values and E values to the multi-layered LDPC decoder 226 and receiving one or more hard decisions. The LEH memory 224 may return interleaved L values or E values to the LE queue 222 for further processing if necessary. Alternatively, the LEH memory 224 and LE queue 222 may send interleaved L values or E values to a de-interleaver 228. The de-interleaver 228 may de-interleave the L values and E values and transfer hard decisions to a HD queue 230. The HQ queue 230 may then output those hard decisions 232.

Figure 3:
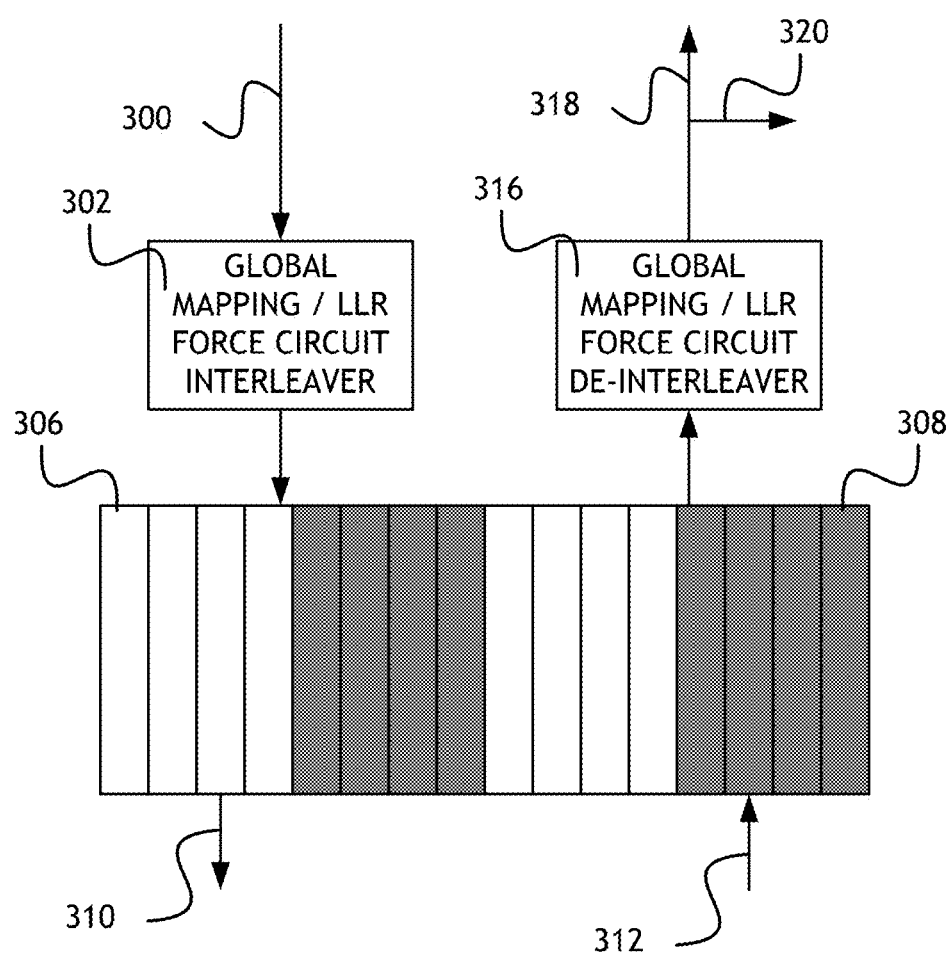
FIG. 3 shows a block diagram of a LEH memory structure.

Referring to FIG. 3, a block diagram of a LEH memory structure is shown. A LEH memory may include one L value port 300 to receive L values from a LE queue. L values may be interleaved by a global mapping LLR force circuit interleaver 302 and sent to one or more data storage banks in the LEH memory.

The LEH memory may include a plurality of storage banks 306, 308. In one embodiment, the LEH memory may include sixteen storage banks 306, 308; eight small storage banks 306 may be fifty-four bits in depth and one hundred sixty-eight bits in width, and eight large storage banks 308 may be fifty-four bits in depth and two hundred sixteen bits in width. The sixteen storage banks 306, 308 may be organized into a ping-pong memory.

The LEH memory may include a L value decoder port 310 connecting the plurality of storage banks 306, 308 to a LDPC decoder to send L values to the LDPC decoder. The LEH memory may also include an E value decoder port 312 connecting the plurality of storage banks 306, 308 to a LDPC decoder to receive E values from the LDPC decoder. The LEH memory may also include a global mapping LLR force circuit de-interleaver 316 to read E values from the plurality of storage banks 306, 308 and send de-interleaved E values to a HD queue port 320 connected to a HD queue and an E value port 318 connected to a LE queue, for example the same LE queue as the L value port 300.

Figure 4:
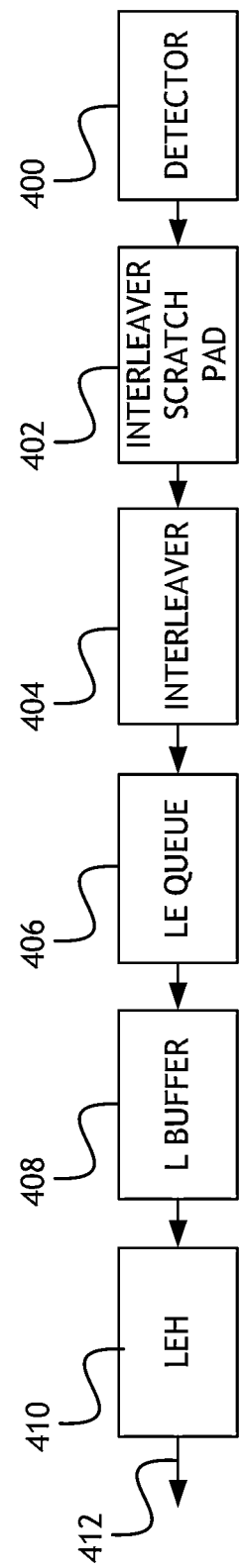
FIG. 4 shows a flowchart of data from a detector to a LEH.

Referring to FIG. 4, a flowchart of data from a detector to a LEH is shown. In a LDPC decoding system with a LEH memory, a detector 400 may receive message bits and send values to an interleaver 404. The interleaver 404 may include an interleaver scratch pad 402. The interleaver 404 may interleave various L values and send the interleaved L values to a LE queue 406. Within the LE queue 406, L values may be saved in a L buffer 408 for transfer to a LEH memory 410. LEH output 412 may include L values, E values or hard decisions.

Figure 5:
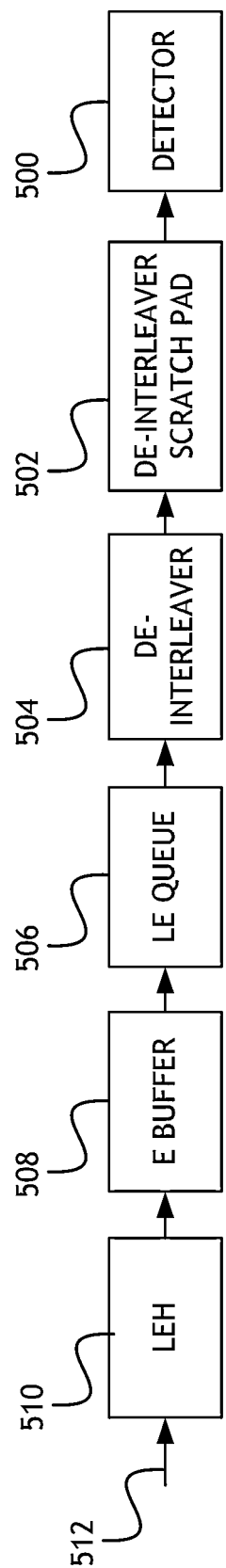
FIG. 5 shows a flowchart of data from a LEH to a detector.

Referring to FIG. 5, a flowchart of data from a LEH to a detector is shown. In a LDPC decoding system with a LEH memory, a LEH memory 510 may receive E values as input 512. The E values may be stored in an E value buffer 508 within a LE queue 506. In some embodiments, the E values may be interleaved, in which case the E values may be transferred to a de-interleaver 504. The de-interleaver 504 may utilize a de-interleaver scratch pad 502. De-interleaved E values may be transferred to a detector 500 for processing.

Figure 6:
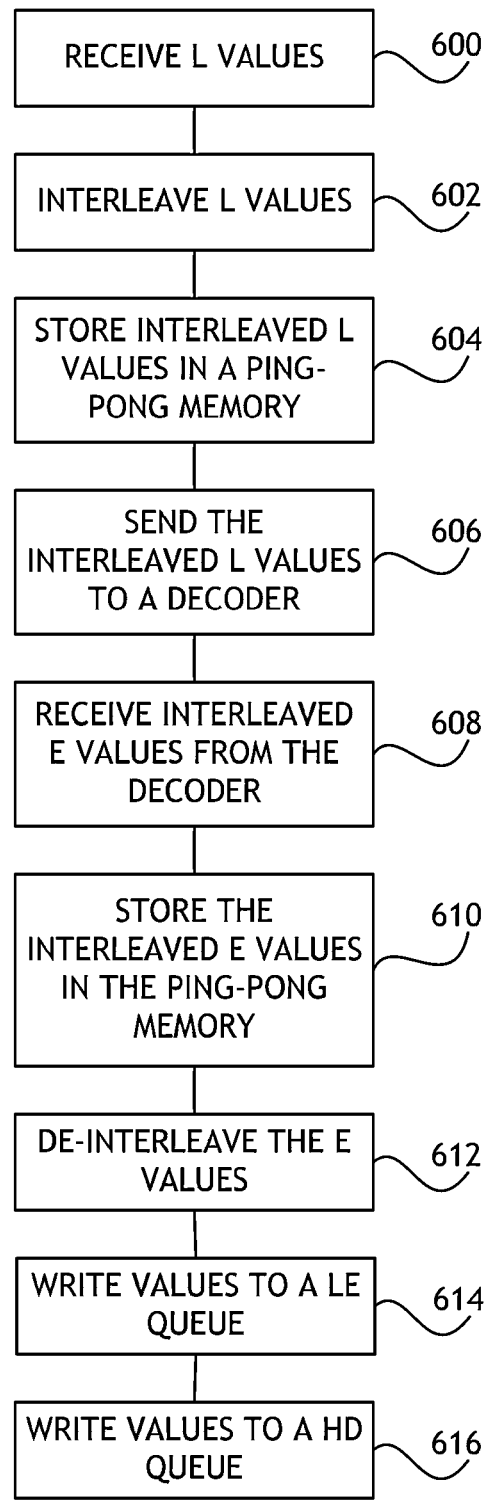
FIG. 6 shows a flowchart for a method of iteratively decoding a LDPC message in a system with LEH memory.

Referring to FIG. 6, a flowchart for a method of iteratively decoding a LDPC message in a system with LEH memory is shown. The LEH memory may receive 600 L values through a L value read port. The L value read port may be connected to a LE queue. A global interleaver may interleave 602 the L values and store 604 the interleaved L values in a ping-pong memory. The ping-pong memory may include a plurality of data storage banks. The plurality of data storage banks may include data storage banks having a depth of fifty-four bits and a width of one hundred sixty-eight bits. The plurality of data storage banks may also include bit enabled data storage banks having a depth of fifty-four bits and a width of two hundred sixteen bits.

Interleaved L values may be sent 606 from the ping-pong memory to a LDPC decoder. The ping-pong memory may then receive 608 and store 610 interleaved E values from the LDPC decoder. The interleaved E values may consist of L values and hard decision values.

A global de-interleaver may then de-interleave 612 the E values. Certain values may then be written 614 to a LE queue through a LE queue write port. Furthermore, hard decision values may be written 616 to a HD queue through a HD queue write port.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of decoding a low-density parity check ("LDPC") encoded message, comprising:
    aligning LDPC encoded bits with a first alignment unit;
    storing the aligned LDPC encoded bits in a Y memory unit;
    aligning the LDPC encoded bits from the Y memory with one or more L values or E values from a local de-interleaver with a second alignment unit;
    performing parity checks for hard decision values;
    interleaving two or more log-likelihood ratio ("LLR") values associated with a LDPC encoded message;
    storing the two or more interleaved LLR values in a memory, said two or more LLR values being received from an LLR or extrinsic LLR ("LE") queue;
    sending the two or more interleaved LLR values to a LDPC decoder;
    receiving two or more extrinsic LLR values from a LDPC decoder;
    writing hard decision ("HD") values every cycle to a HD queue; and
    storing the two or more extrinsic LLR values in the memory.

2. The method of claim 1, wherein sending the two or more interleaved LLR values to a LDPC decoder comprises sending at least 96 interleaved LLR values to the LDPC decoder.

3. The method of claim 1, further comprising:
    de-interleaving the two or more extrinsic LLR values; and
    writing LLR values to the LE queue,
    wherein the two or more extrinsic LLR values comprise at least one LLR value and at least one hard decision value.

4. The method of claim 3, wherein:
    writing LLR values to the LE queue comprises writing at least 9 LLR values per clock-cycle; and
    writing hard decision values every cycle to the HD queue comprises writing at least 9 hard decision values per clock-cycle.

5. The method of claim 1, wherein the memory comprises a ping-pong memory, and wherein the memory further comprises:
    a first data bank 54 bits deep and 168 bits wide; and
    a second data bank 54 bits deep and 216 bits wide,
    wherein the second data bank is bit enabled.

6. A combined memory apparatus in a low-density parity check ("LDPC") decoder, comprising:
    a parity check unit;
    an interleaver;
    a first alignment unit;
    a second alignment unit;
    a Y memory unit;
    a memory connected to the interleaver;
    an hard decision ("HD") queue connected to the memory;
    an extrinsic log-likelihood ratio ("LE") queue connected to the memory; and
    a de-interleaver connected to the memory,
    wherein:
        the first alignment unit is configured to align LDPC encoded bits;
        the Y memory unit is configured to store the aligned LDPC encoded bits;
        the second alignment unit is configured to align the LDPC encoded bits from the Y memory with one or more L values or E values from the de-interleaver;
        the parity check unit is configured to send hard decision values to a LDPC decoder;
        the interleaver is configured to interleave two or more log-likelihood ratio ("LLR") values;
        the memory is configured to send two or more interleaved LLR values to the LDPC decoder;
        the memory is configured to receive two or more interleaved extrinsic LLR values from the LDPC decoder; and
        the de-interleaver is configured to de-interleave the two or more extrinsic LLR values, and the de-interleaver is further configured to write HD values every cycle to the HD queue.

7. The apparatus of claim 6, wherein the memory is configured to send two or more interleaved LLR values to a LDPC decoder at a rate of at least 96 interleaved LLR values per clock-cycle.

8. The apparatus of claim 6, wherein the de-interleaver is further configured to:
    write one or more LLR values to the LE queue; and
    write one or more hard decision values to the HD queue through an HD queue write port.

9. The apparatus of claim 8, wherein the de-interleaver is further configured to:
    write the one or more LLR values to the LE queue at a rate of at least 9 LLR values per clock-cycle; and
    write one or more hard decision values to the HD queue at a rate of at least 9 hard decision values per clock-cycle.

10. The apparatus of claim 6, wherein the memory comprises a ping-pong memory.

11. The apparatus of claim 6, wherein the memory comprises:
    a first data bank 54 bits deep and 168 bits wide; and
    a second data bank 54 bits deep and 216 bits wide,
    wherein the second data bank is bit enabled.

12. A low-density parity check ("LDPC") decoding apparatus, comprising:
    a combination extrinsic log-likelihood ratio ("LE") queue/hard decision ("HD") queue ("LEH") memory unit comprising:
        a parity check unit;
        an interleaver;
        a first alignment unit;
        a second alignment unit;
        a Y memory unit;
        a memory connected to the interleaver; and
        a de-interleaver connected to the memory;
    a LE queue connected to the LEH memory;
    a HD queue connected to the LEH memory; and
    a LDPC decoder connected to the LEH memory and the parity check unit, wherein:
        the first alignment unit is configured to align LDPC encoded bits;
        the Y memory unit is configured to store the aligned LDPC encoded bits;

the second alignment unit is configured to align the LDPC encoded bits from the Y memory with one or more L values or E values from the de-interleaver;

the parity check unit is configured to send one or more hard decision values to the LDPC decoder;

the interleaver is configured to receive two or more log-likelihood ratio ("LLR") values from the LE queue and interleave the two or more LLR values;

the memory is configured to send two or more interleaved LLR values to the LDPC decoder;

the memory is configured to receive two or more interleaved extrinsic LLR values from the LDPC decoder; and the de-interleaver is configured to de-interleave the two or more extrinsic LLR values, and the de-interleaver is further configured to write HD values every cycle to the HD queue.

13. The apparatus of claim 12, wherein the memory is configured to send two or more interleaved LLR values to the LDPC decoder at a rate of at least 96 interleaved LLR values per clock-cycle.

14. The apparatus of claim 12, wherein the de-interleaver is further configured to:
write one or more LLR values to the LE queue; and
write one or more hard decision values to the HD queue through an HD queue write port.

15. The apparatus of claim 14, wherein the de-interleaver is further configured to:
write the one or more LLR values to the LE queue at a rate of at least 9 LLR values per clock-cycle; and
write one or more hard decision values to the HD queue at a rate of at least 9 hard decision values per clock-cycle.

16. The apparatus of claim 12, wherein the memory comprises a ping-pong memory.

17. The apparatus of claim 16, wherein the memory comprises:
a plurality of first data banks having a first bit width; and
a plurality of second bit-enabled data banks having a second width.

18. The apparatus of claim 12, wherein the memory comprises:
a first data bank 54 bits deep and 168 bits wide; and
a second data bank 54 bits deep and 216 bits wide, wherein the second data bank is bit enabled.

19. The apparatus of claim 12, wherein the LDPC decoder is a multi-layer decoder.

20. The method of claim 3, further comprising positioning the de-interleaver to de-interleave the at least one hard decision value before writing hard decision values to the HD queue.

* * * * *